United States Patent
Reichel et al.

(10) Patent No.: US 10,041,829 B2
(45) Date of Patent: Aug. 7, 2018

(54) UV LIGHT SENSOR WITH STRAY LIGHT SUPPRESSION, AND A METHOD FOR DETECTING UV LIGHT

(71) Applicant: IDT EUROPE GMBH, Dresden (DE)

(72) Inventors: Thomas Reichel, Dresden (DE); Lutz Schiffner, Langebruck (DE); Matthias Garzarolli, Dresden (DE); Matthias Sandig, Dresden (DE); Lars Gopfert, Dresden (DE)

(73) Assignee: IDT Europe GmbH, Dresden (DE)

( * ) Notice: Subject to any disclaimer, the term of this patent is extended or adjusted under 35 U.S.C. 154(b) by 0 days.

(21) Appl. No.: 15/312,522

(22) PCT Filed: May 19, 2015

(86) PCT No.: PCT/EP2015/060969
§ 371 (c)(1),
(2) Date: Nov. 18, 2016

(87) PCT Pub. No.: WO2015/177129
PCT Pub. Date: Nov. 26, 2015

(65) Prior Publication Data
US 2017/0108372 A1    Apr. 20, 2017

(30) Foreign Application Priority Data
May 19, 2014   (DE) .................. 10 2014 107 062

(51) Int. Cl.
*G01T 1/24*       (2006.01)
*G01J 1/02*       (2006.01)
(Continued)

(52) U.S. Cl.
CPC ............. *G01J 1/0214* (2013.01); *G01J 1/429* (2013.01); *G01J 1/44* (2013.01); *H01L 27/1462* (2013.01);
(Continued)

(58) Field of Classification Search
CPC ............. G01J 1/0214; G01J 1/429; G01J 1/44
(Continued)

(56) References Cited

U.S. PATENT DOCUMENTS 6,821,810 B1    11/2004    Hsiao et al.
2005/0052643 A1*  3/2005  Lange ................ G01N 21/9501
                                                        356/237.1
(Continued)

FOREIGN PATENT DOCUMENTS

EP         1646088 A1     4/2006

OTHER PUBLICATIONS

International Search Report for PCT Application No. PCT/EP2015/060969 issued by the EP Searching Authority on May 19, 2014; pp. 1-4.
(Continued)

*Primary Examiner* — David Porta
*Assistant Examiner* — Meenakshi Sahu
(74) *Attorney, Agent, or Firm* — Haynes and Boone, LLP

(57) ABSTRACT

The invention relates to a UV light sensor produced in a CMOS method, comprising a substrate that has a surface, one or more sensor elements that detect radiation and are designed in said substrate, at least one passivation layer arranged over said substrate surface, and a functional layer that is arranged over said passivation layer and designed in the form of at least one filter. The problem addressed by the invention of providing a UV light sensor which is sensitive exclusively within the UV wavelength range is solved, in terms of arrangement, by means of filters designed directly on a planar passivation layer, and stray light suppressing means around said at least one sensor element and/or around the UV light sensor. In terms of the method, the problem is solved by measuring two output signal from at least two
(Continued)

photo diodes fitted with different filters, and by determining a mathematical relationship between the two output signals.

22 Claims, 7 Drawing Sheets

(51) Int. Cl.
  *H01L 27/146* (2006.01)
  *G01J 1/42* (2006.01)
  *G01J 1/44* (2006.01)
(52) U.S. Cl.
  CPC .. *H01L 27/14623* (2013.01); *H01L 27/14636* (2013.01); *H01L 27/14643* (2013.01); *G01J 2001/446* (2013.01)
(58) Field of Classification Search
  USPC .................................................. 250/370.14
  See application file for complete search history.

(56) References Cited

U.S. PATENT DOCUMENTS

| | | |
|---|---|---|
| 2006/0197097 A1 | 9/2006 | Mori |
| 2007/0187794 A1* | 8/2007 | Fukuyoshi ............. G02B 5/223 257/440 |
| 2010/0178018 A1 | 7/2010 | Augusto |
| 2010/0308345 A1* | 12/2010 | Brown ................ G02F 1/13318 257/82 |

OTHER PUBLICATIONS

Written Opinion for PCT Application No. PCT/EP2015/060969 issued by the EP Searching Authority on May 19, 2014; pp. 1-5.
National Examination Report—1st Official Action dated Oct. 18, 2017 on corresponding Chinese Patent Application No. CN 201580039107.X, pp. 1-9.

* cited by examiner

Fig. 3b (Novel)

Fig. 11a
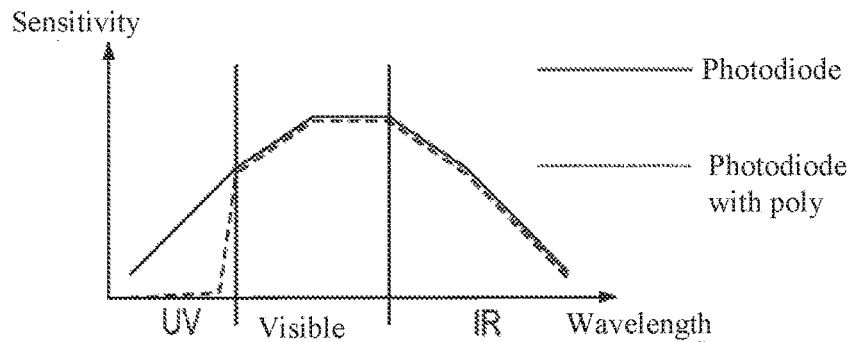
Fig. 11b
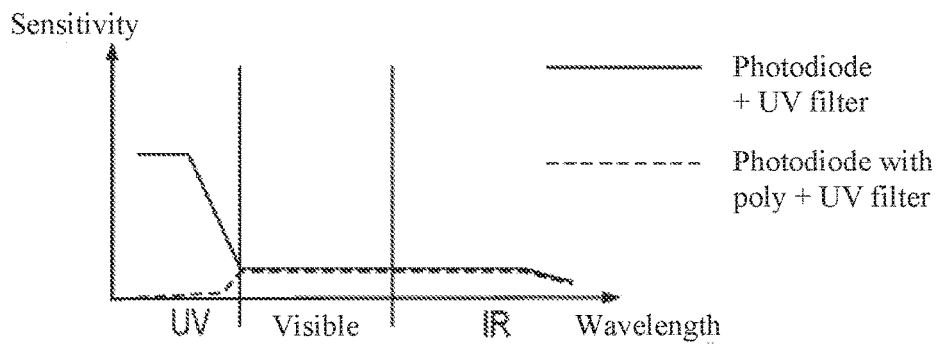
Fig. 12
| | C | Dark compensation |
| | G/ALS | Ambient light |
| | UV | UV |
| | UV poly | UV VIS/IR compensation |
| | x | Utilization not defined | ical damage and as a diffusion barrier against

UV LIGHT SENSOR WITH STRAY LIGHT SUPPRESSION, AND A METHOD FOR DETECTING UV LIGHT

The present application is claiming priority to International Patent Application no. PCT/EP2015/060969, filed 19 May 2015, which claims priority to German Patent Application no. 10 2014 107 062.3, filed 19 May 2014, incorporated herein by reference.

The invention relates to a UV sensor produced by a CMOS process, comprising a substrate that has a surface, one or more sensor elements that detect radiation and are designed in the substrate, at least one passivation layer arranged over the substrate surface, and a functional layer that is arranged over the passivation layer, wherein the functional layer is designed in the form of at least one filter.

The invention furthermore relates to a method for detecting UV light with a UV light sensor, wherein the one or more sensor elements detect light and in response thereto generate a signal.

UV sensors (ultraviolet radiation detecting sensors) are used in numerous products, wherein the sensors are used both as individual UV-sensitive photodiodes (single-element photodiodes) and also as integrated circuits (ICs) comprising evaluation and control units. The dominant fields of use include water sterilization, medical technology, UV curing, and flame detection. In medical technology, the UV sensors are used, for example, for determining the oxygen content in blood and the pulse rate. Another important field of use is the determination of the UV index and of ambient brightness. In this use, the UV component of the solar radiation is measured and communicated to the user, when said component exceeds a limit value above the recommended daily dose. Especially for persons susceptible to sunburn or persons with sensitive skin, sensors that measure the UV index can provide an early warning. The UV index is a number that is linearly dependent on the intensity of the solar light incident on the earth and that has been standardized by the World Health Organization (WHO).

Silicon-based UV-sensitive photodiodes are known. However, the disadvantage of using Si diodes in the UV wavelength range is that the sensitivity or responsiveness maximum is in the wavelength range of (600 . . . 800) nm. The terms sensitivity and responsiveness are used synonymously. The sensitivity of the Si diodes is lower in the UV range of (280 . . . 400) nm than in the VIS/IR wavelength range (FIG. 1). Here, VIS describes the visible, i.e., the visual range of the electromagnetic spectrum, and IR describes the infrared range. In order to achieve sensitivity in the UV range as well, filters are used that are transparent only for the UV wavelength range of interest and opaque for any other radiation of the electromagnetic spectrum.

Sensors made of silicon moreover have the disadvantage that the long-wave components of the measured radiation bring about a greater penetration depth into the silicon, which results in the penetrating photons producing a charge carrier generation and/or a charge carrier depletion at the pn transitions, which are usually located deep in the bulk material and far from the site of entry of the radiation to be detected, and thus distort the measured values. FIG. 2 shows the penetration depth in silicon as a function of the wavelength of the incident radiation (http://www.elektroniknet.de/automation/sonstiges/artikel/31275/1).

Moreover, from the prior art, spectrally optimized UV photodiodes are known. Spectrally optimized is understood to mean that the spectral sensitivity maximum of the detectors is in the UV range of (280 . . . 400) nm, i.e., the detectors are optimized for measurements of the UV component in an electromagnetic radiation spectrum. On the one hand, this can be influenced by the material selection for the photodiode used and thus by the predetermined spectral sensitivity characteristic, and, on the other hand, an additional filter can be used, which is transparent only for the UV wavelength range of interest. For example, photodiodes are known that are based on silicon carbide, indium gallium nitride, gallium nitride or aluminum gallium nitride.

In addition, in spectrally optimized UV photodiodes, high demands are to be made on the evaluation unit. For example, for a usable measurement, at least one reference sensor is always necessary. Moreover, no simple combination with other optical sensors, for example, ambient light sensors (ALS), color sensors or color temperature sensors (RGB sensor), or proximity sensors (PS), is possible.

Often, the UV-sensitive photodiodes are also integrated in circuits, so-called ICs, comprising evaluation and control units. The disadvantage of known IC designs is that they have, in addition to a low UV sensitivity, also high spectral sensitivity in the visible and infrared range (FIG. 1) (see also DE 10 2012 001 481 A1 and DE 10 2012 001 070 A1). Thus, in a measured light spectrum, the UV component can be determined only via correlation calculations, which require that the light spectrum is known. However, in practice, this is often not the case. Thus, an optical sensor that is standardized, for example, to the spectrum of sunlight, would produce erroneous measured values when operated in artificial light, due to the differing wavelength components in the spectrum of the artificial light and of sunlight. The temporal change in the spectrum of sunlight over the course of a day also plays a role. If the temporal change is not taken into consideration, the measurement of the UV light component yields only inaccurate values. Therefore, exact measurements of the UV light component of a radiation source are only possible if the sensor is sensitive or responsive exclusively in the UV range to be measured. Radiation source is understood to be any body at a temperature above the absolute zero that emits electromagnetic radiation. Any body at a temperature above absolute zero emits a characteristic electromagnetic spectrum as a function of its temperature.

The UV wavelength range of interest is (280 . . . 400) nm. The range of (280 . . . 320) nm is referred to as UV-B and the range of (320 . . . 400) nm is referred to as UV-A, wherein the UV-A component represents the more dangerous component for the human skin. The IR wavelength range comprises the wavelength range of (0.78 . . . 1000) μm. The VIS wavelength range comprises the visible spectrum in the wavelength range of (400 . . . 780) nm.

The problem of the invention is to provide UV light sensors produced in a CMOS process, which eliminate the disadvantages known in the prior art, wherein the UV sensor should be sensitive exclusively in the UV wavelength range, or wherein any interfering radiation outside of the UV range is suppressed using appropriate means, so that the sensor has no sensitivity in other wavelength ranges, or the measurement result is not distorted by interfering radiation, in order to thus determine a precise UV index value.

The problem is solved by a UV light sensor according to the preamble of Claim 1 in that the passivation layer is of planar design, and the filter is designed directly on the planar passivation layer, and stray light suppressing means are designed around the at least one sensor element and/or around the UV light sensor.

In the prior CMOS technology process, for the protection against mechanical damage and as a diffusion barrier against moisture and ions, a passivation layer made of $SiO_2$ and $Si_3N_4$ is applied after the production of the last wiring plane. In the process, as represented in FIG. 3a, steps are formed at the transitions between the sensitive sensor element and the contacting surface, so that no planar surface is produced. In the UV light sensor according to the invention, before the deposition of the filter material, the $SiO_2$ passivation is leveled by an ablation process, for example, CMP and/or lapping, so that a planar deposition of the $Si_3N_4$ passivation and the filter material can occur over the entire chip surface (FIG. 3b). In the process, the useful life of the filter under harsh environmental influences can be improved. Due to the planarization of the passivation layer occurring beforehand, the filter material can be deposited on a planar surface, as a result of which more regular optical properties can be achieved, due to the homogeneous layer thicknesses of the filter(s) over the entire chip surface.

By means of the proposed stray light suppressing means, the vertical and also the lateral/horizontal penetration of light into the sensor element(s) of the UV light sensor can be prevented.

In the design of the invention, the stray light suppressing means are formed at least partially by the filter. In the process, the filter completely covers at least the respective sensor element, wherein the filter element preferably moreover extends beyond the respective sensor element. It is particularly advantageous if the filter is designed over the entire surface of the entire UV light sensor, and it is even more advantageous if the filter extends over the entire IC, i.e., up to the margin thereof. The margin of the IC in which the UV light sensor is integrated is determined primarily by the size of the Si substrate. The functional layer, which is formed as at least one filter, can also be formed from different filter materials, wherein the filter edges overlap so that the penetration of stray light is prevented. When different filter materials are used, arranged, for example, over a matrix of sensor elements, it is particularly advantageous if the transition of the different filter materials is designed in the area of an active sensor surface that is not a UV light sensor element. As a result, the optical opening of the underlying sensor element is reduced, but, thereby, a clear reduction of the stray light coupling on adjacent UV light sensor elements of the matrix of sensor elements can be achieved. The contact pads of the UV light sensor with the downstream electronics or the evaluation circuits are not covered by the functional layer.

In an additional design of the proposed UV light sensor, the stray light suppressing means are formed at least partially by a metal layer arranged over the entire surface on the UV light sensor and/or the entire IC, leaving the sensor elements uncovered. As a result, a penetration of light up to the silicon surface is prevented at the places that cannot be covered by filters (for example, surfaces around the bond pads). In addition, residual light, which would penetrate into the IC due to a limited stop band suppression of the filter, can be screened before it hits the silicon surface.

In a design of the proposed UV light sensor, the stray light suppressing means are formed at least partially by light barriers bordering the UV light sensor laterally. Laterally bordering light barriers are borders made of suitable light-screening materials that prevent lateral or sideways penetration of light into the UV light sensor and thus into the IC in which the UV light sensor is integrated.

In an additional design of the proposed UV light sensor, the stray light suppressing means are formed at least partially by embedding the UV light sensor in an opaque material, wherein the opaque material encloses the margin of the UV light sensor. The opaque material can be a molding material that is tightly fitted with bonded connection around the IC in a packing process.

Moreover, in a design of the proposed UV light sensor, the stray light suppressing means are formed at least partially by an opaque material on the back side of the UV light sensor. By an encapsulation of the IC with molding material in the packing process, the stray light irradiation via the back side of the IC can be prevented.

In an additional design of the proposed UV light sensor, the stray light suppressing means are formed at least partially by trenches filled opaque material bordering the respective sensor element laterally. The trenches can be formed by etching into the passivation layer, so that so-called etched passivation trenches are formed. As a result, a suppression of light guiding in the passivation plane can be achieved.

In an additional design of the proposed UV light sensor, reflections and light guiding in intermetallic dielectric materials in the metallization complex of the IC, i.e., the oxides between the wiring planes, can be prevented, by forming the stray light suppressing means at least partially by means of light barriers, which are vertical with respect to the substrate surface, in the CMOS wiring planes above the sensor elements formed in the substrate. In a particular design, the vertical light barriers in the CMOS wiring plane are formed by closed contact rings or/and by via rings arranged offset extending into a top metal plane of the CMOS process, which are interrupted only by the needed minimum electrical contacting of the photodiodes, i.e., of the sensor elements. In the case of a multi-step ring structure, the passage openings (vias) for the connection lines of the sensor elements are arranged offset, so that no continuous light path forms. A light path describes a path from the site of entry of the radiation into the substrate to the sensitive sensor element.

In a particular design of the UV light sensor, several sensor elements are arranged in a matrix, wherein the sensor elements comprise at least one photodiode with UV filter, a photodiode designed as ALS sensor and a photodiode with a polysilicon coating and a UV filter.

Preferably, the matrix can be designed as a 4×4 matrix with optimized half-space sensitivity, wherein the matrix is formed by four different sensor elements. The sensor elements can be designed as a photodiode with UV filter and/or an ALS sensor and/or a photodiode with a polysilicon coating and a UV filter. The half-space of the UV light sensor includes the whole space above the UV light sensor, i.e., above the substrate plane, wherein, in the case of an optimized half-space sensitivity, the sensitivity of the UV light sensor should be as equal as possible from each spatial direction of the half-space.

The optimized half-space sensitivity is set in that the different sensor elements meet the following arrangement criteria:
  each sensor element is arranged once in the corner of the matrix,
  each sensor element is arranged twice on the side edge of the matrix,
  each sensor element is arranged once per row of the matrix,
  each sensor element is arranged once per column of the matrix,
  each sensor element is arranged once in the 4 2×2 sub quadrants of the matrix.

The advantage of this arrangement is that thereby the stray light entering the array can be distributed equally over all the sensor elements in a controlled manner, i.e., each sensor element sees to the extent possible the same stray light components, this being possible even with different incidence angles of the light. In this way, for example, influences on the measurement signal due to particles or fabrication residues on the UV light sensor can be suppressed. Indeed, it is precisely by the arrangement and the possible averaging of the light components from all the spatial directions above the UV light sensor that the half-space sensitivity can be optimized substantially.

Moreover, for the different sensor elements, interference-based filters with highly refractive materials can also be used, in order to obtain a low spectral angular dependency.

In terms of the method, the problem of the invention is solved by a method for detecting UV light with the proposed UV light sensor, wherein the one or more sensor elements detect light and in response thereto generate a signal, in that a first output signal of a sensor element, which is designed as a photodiode, is measured, in that a second output signal of a sensor element, which is designed as a photodiode with a polysilicon coating, is measured and weighted by a factor, and a mathematical relationship between the first and second output signals is determined. As mathematical relationship, it is possible, for example, to calculate the difference between the first and second output signals. In the process, the first output signal is formed by a UV component, a VIS/IR component, and a leakage current component, and the second output signal is formed by a weighted VIS/IR component and a weighted leakage current component. By using the difference principle, the VIS/IR sensitivity of the UV light sensor can be compensated, in that only the VIS/IR component and the leakage current component are measured by the photodiode with the polysilicon coating, and the measured signal of the photodiode is corrected by these components.

In an additional method according to the invention for detecting UV light with the UV light sensor according to the invention, the problem of the invention is solved in that a first output signal of a sensor element, which is designed as a photodiode, is measured, a second output signal of a sensor element, which is designed as a dark diode, is measured and weighted by a factor, wherein the dark diode is coated with an opaque metal, and a mathematical relationship between the first and second output signals is determined. As mathematical relationship, it is possible to calculate, for example, the difference between the first and second output signals. By using the difference principle, the temperature-dependent dark currents (leakage currents) of the UV light sensor can be compensated, by measuring only the leakage current by means of the dark diode due to the opaque metal coating, and thus the measurement signal of the photodiode can be corrected by these components.

The two above-mentioned compensation methods can also be combined, wherein thereby both the VIS/IR sensitivity and also the dark currents (leakage currents) can be compensated, and thereby an accurate UV index value is determined.

Using the above described UV light sensor and the described evaluation methods, a monolithic integration of an individual or multi-channel UV light sensor with evaluation units can be carried out in a very simple manner in a CMOS process. The spectral adaptation of the sensor sensitivities in the UV wavelength range can be adapted by a simple application of dedicated optical filters. Due to the integration in a CMOS process, a relationship between the UV light sensor function and additional environmental sensors, such as ALS, RGB, PS, pressure, gas, moisture sensors, is possible, wherein this does not constitute a comprehensive list. By means of the arrangement according to the invention, the penetration of stray light penetrating around the applied optical filter into the UV light sensor or the IC can be prevented.

Below, the invention will be explained in further detail in reference to embodiment examples.

In the associated drawings

Figure 5:
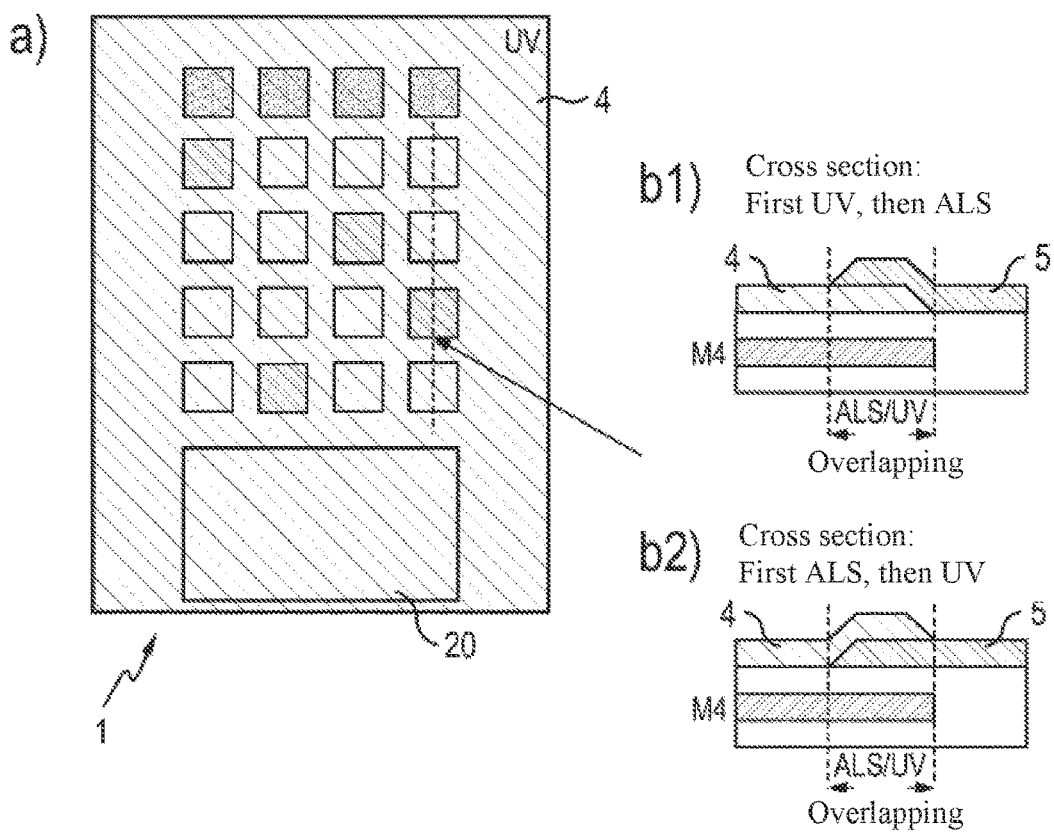
Figure 6A:
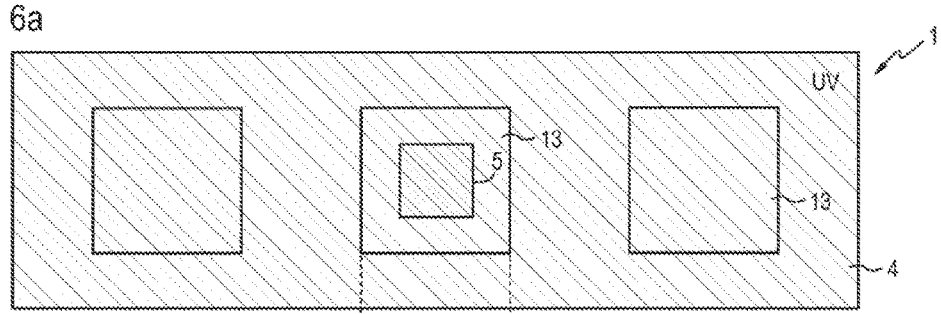
Figure 7:
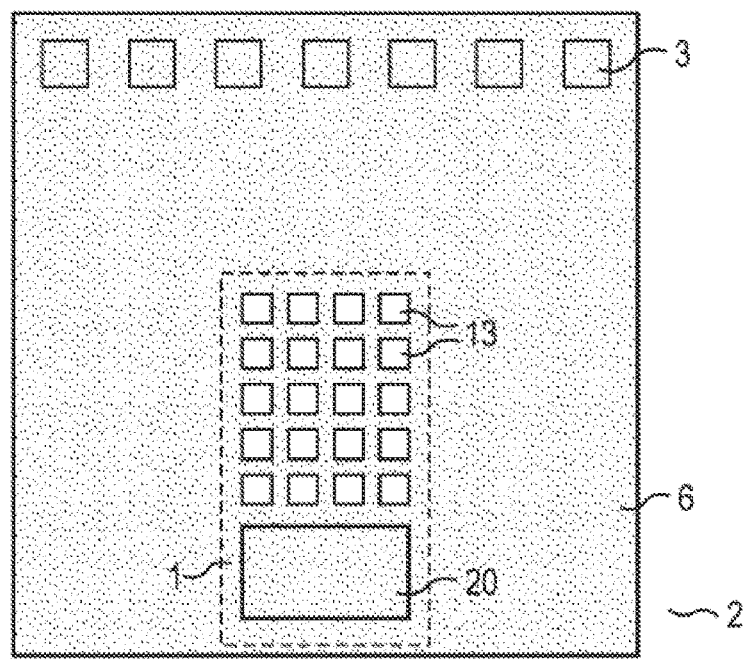
Figure 9:
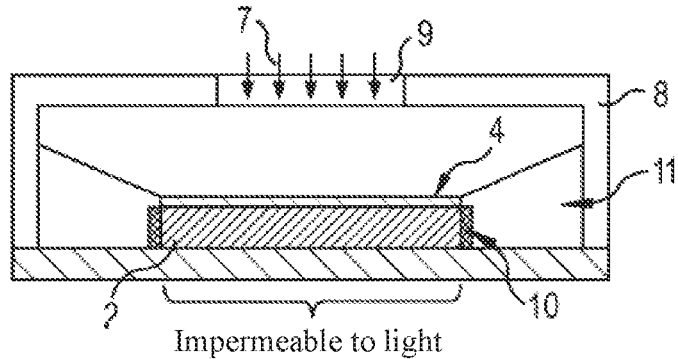
Figure 10:
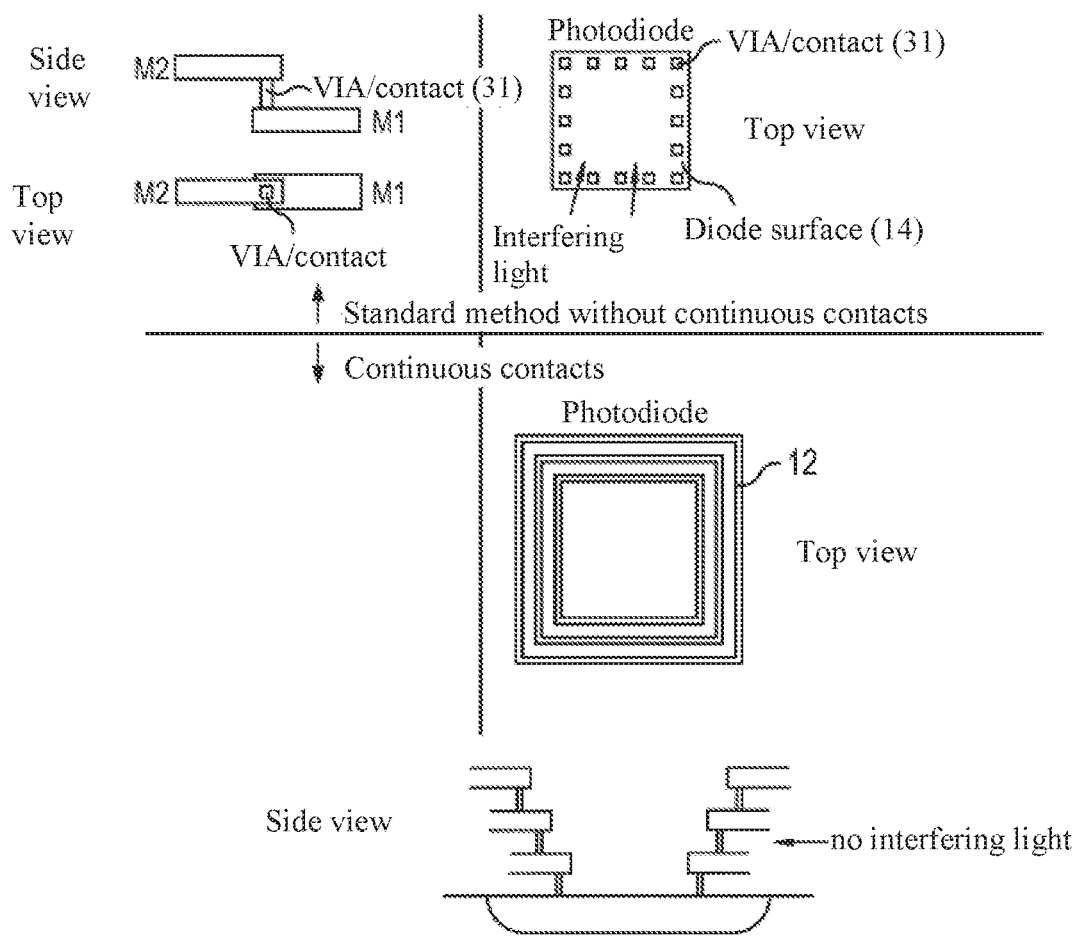

FIG. 5 shows the overlapping of the filters, in order to allow as little stray light as possible to penetrate at the boundary sites; in the process, the UV filter is brought as close as possible to the optical opening of the other sensor element, in order to maximize the degree of coverage of the UV filter; a) top view, b1) the second filter material covers the UV filter, b2) the UV filter covers the second filter material;

FIG. 6 shows the extension of the UV filter (hatched) into the optical opening of the ALS sensor, a) top view, b) side view;

FIG. 7 shows a top view of an IC with UV light sensor coating of the entire IC with metal, except for the sensor elements;

FIG. 8 shows a diagrammatic representation of an IC with UV light sensor in a housing a) without and b) with stray light suppressing means, with, among other things, the light barriers that laterally border the IC;

FIG. 9 shows a diagrammatic representation of an IC with UV light sensor in a housing with light barriers, embedding in opaque molding material, arrangement of opaque molding material on the IC back side;

FIG. 10 shows a diagrammatic representation of stray light suppressing means that are formed by closed contact rings and/or by via rings arranged offset, as a result of which the penetration of stray light by light guiding or by reflections is prevented;

FIG. 11 shows a diagrammatic representation of the compensation with a photodiode, which is coated with poly Si for case a) without UV filter and b) with UV filter;

FIG. 12 shows a diagrammatic representation of a matrix of diodes with different filters and thus with different functions.

Figure 1:
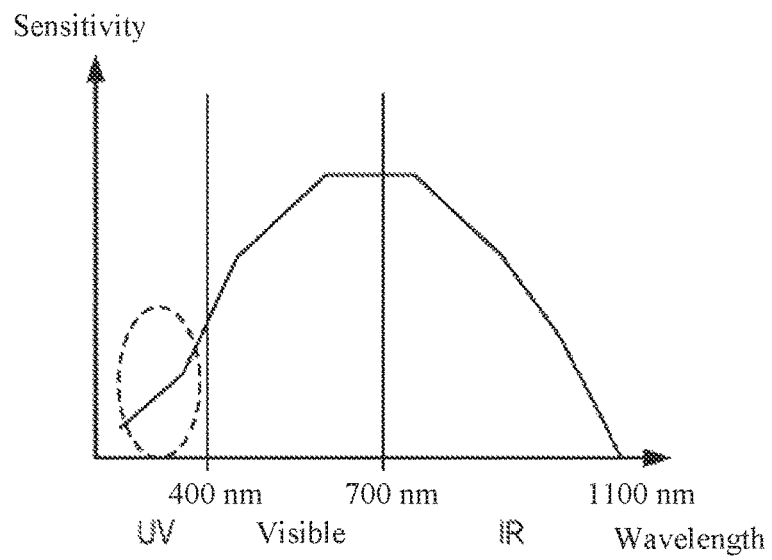
FIG. 1 shows the spectral sensitivity of known IC structures.
Figure 2:
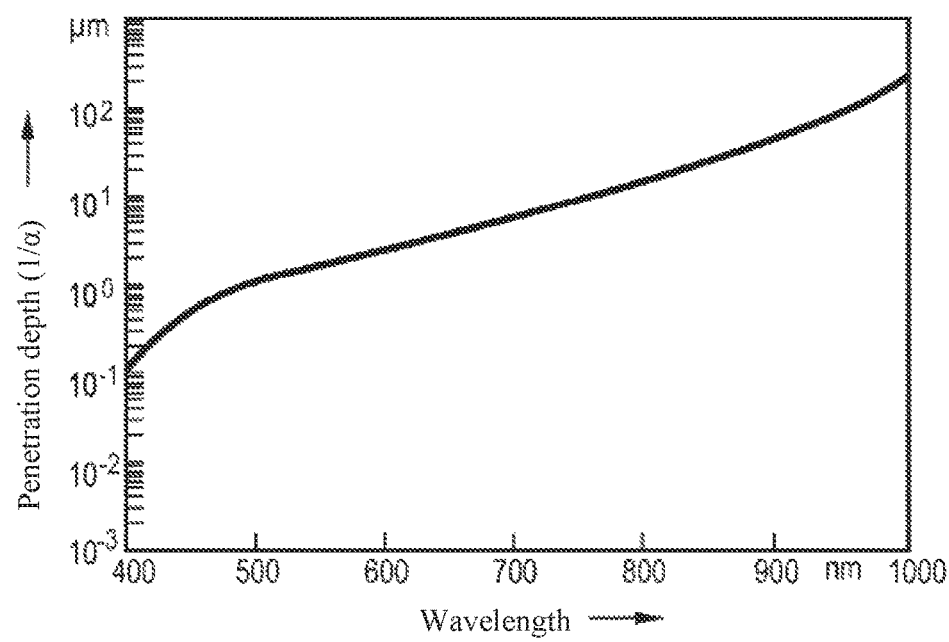
FIG. 2 shows the penetration depth of radiation in silicon as a function of the wavelength of the incident radiation.
Figure 3A:
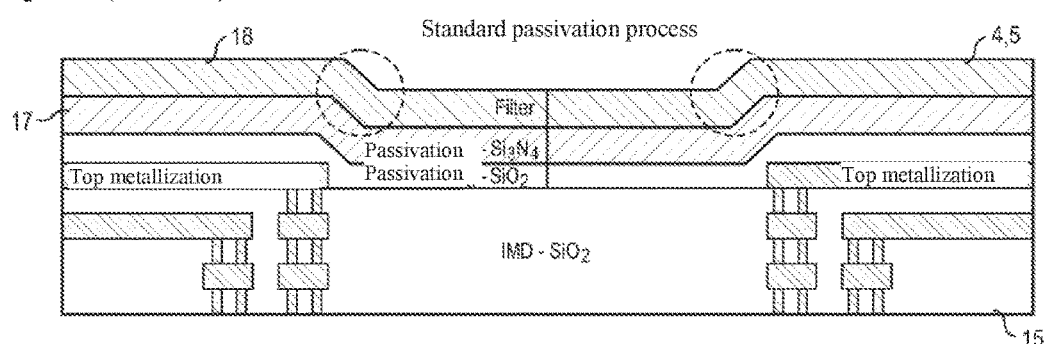
FIG. 3 shows a passivation process a) according to the prior art, b) according to the present invention.
Figure 3A:
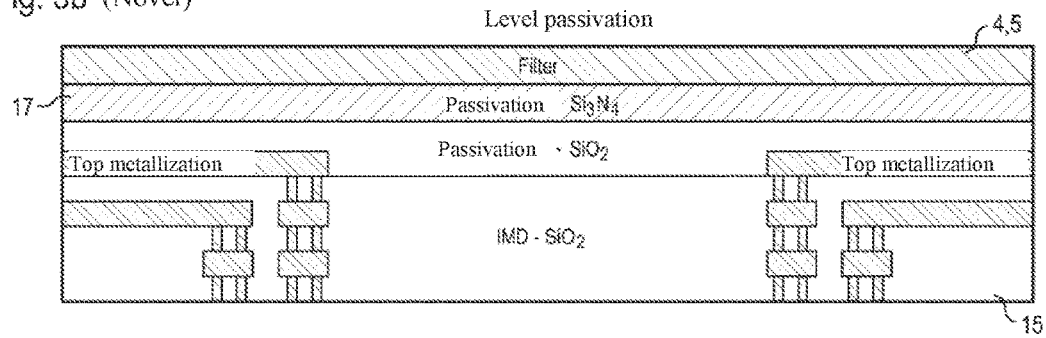
Figure 4:
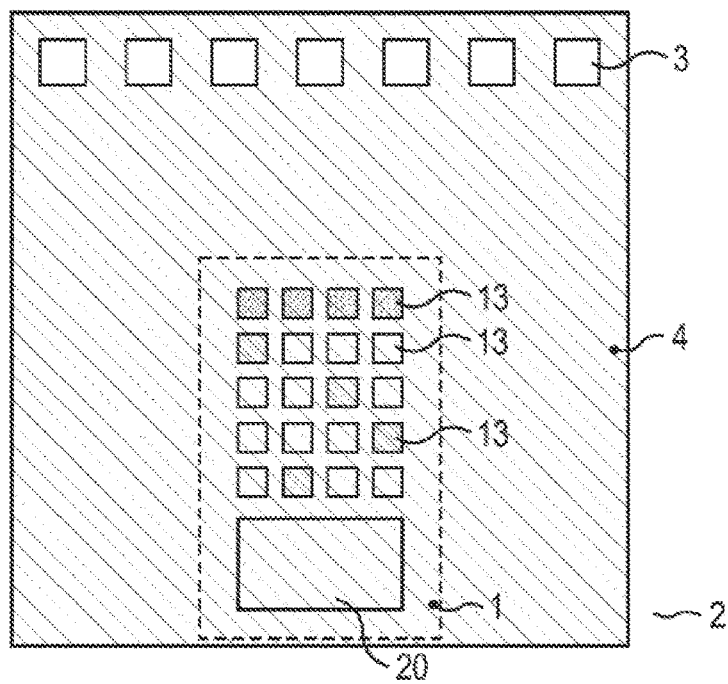
FIG. 4 shows a top view of an IC with UV light sensor, wherein the entire IC with UV filter (hatched), pads removed, and, if applicable, other filter positions (dense hatching), is coated.

FIG. 4 shows a design of the invention in which the filter 4 is formed over the entire surface of the IC 2 with the integrated UV light sensor 1 with associated signal processing 20. As a result, a vertical penetration of light outside of one or more sensor elements 13 can be prevented. In the process, the contact pads 3 for the IC are not covered by the filter 4. It is also possible to arrange different filters 4, 5 over individual sensor elements 13, wherein different radiation components can then be detected with the sensor elements 13. In a design, several sensor elements can be designed as dark diodes DD, on which no radiation at all is incident.

If different filters 4, 5 are used within a UV light sensor 1, then, on the transitional areas of the filters 4, 5, no interfering radiation should reach the sensor elements 13 either. In order to prevent this, the different filter materials in the transition areas are designed with overlap, as represented diagrammatically in FIG. 5 b1), b2).

Figure 6B:
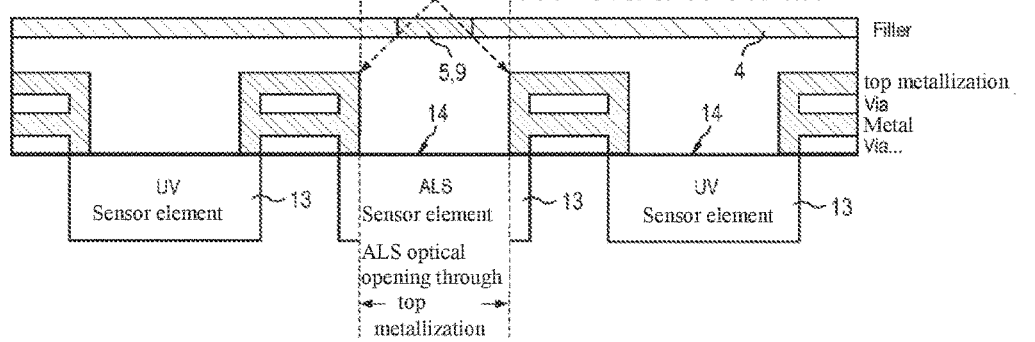

FIG. 6 shows a design of the invention in which the stray light suppressing means are formed by two different filter materials 4, 5. On the one hand, they are formed by a UV filter 4 and, on the other hand, by a second filter material 5. The filters are arranged over a matrix of sensor elements 13, wherein the sensor elements 13 comprise UV and ALS sensor elements. The two filter materials 4, 5 are arranged so that the UV filter 4 is positioned above the UV sensor elements, and the second filter material 5 is positioned above the ALS sensor elements. In the process, it is particularly advantageous if the extension of the UV filter 4 reaches into the optical opening 9 of the ALS sensor element (FIG. 6b). In the process, the aperture or orifice or optical opening of the ALS sensor element is decreased by the UV filter 4, and thus the sensitivity thereof is reduced, for example, $\frac{1}{3}$ surface corresponds to a decrease in the sensitivity of the ALS sensor element 13 by $\frac{1}{3}$. However, the reduced sensitivity can be tolerated, since, as a result of the overlapping, a clear reduction of the stray light coupling on the adjacent UV sensor elements 13 can be achieved. Indeed, due to the expansion of the UV filter 4 into the active sensor surface 14 of the ALS sensor element (i.e., in a projection above the active sensor surface 14), clearly less stray light passes through the ALS filter 5 onto the top metal. At the top level, the coupled in stray light 7 would in fact again be able to move on, as in a light guide, to the UV sensor element 13. This can be clearly reduced by the described design.

FIG. 7 shows a large-surface metal coating 6 of the entire IC 2 with the integrated UV light sensor 1. As a result, the progression of light to the silicon surface can be prevented at the sites that cannot be covered by filters (for example, surfaces around the bond pads 31 (not represented) of the individual sensor elements). Moreover, in this way any residual light that would penetrate into the IC 2, due to a limited stop band suppression of the filter, can be screened from hitting the silicon surface.

Figure 8A:
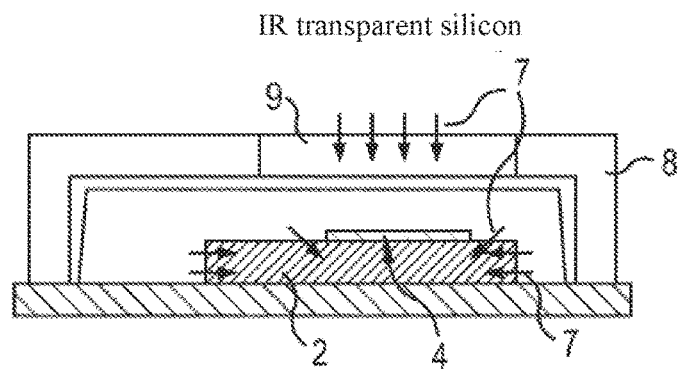
Figure 8B:
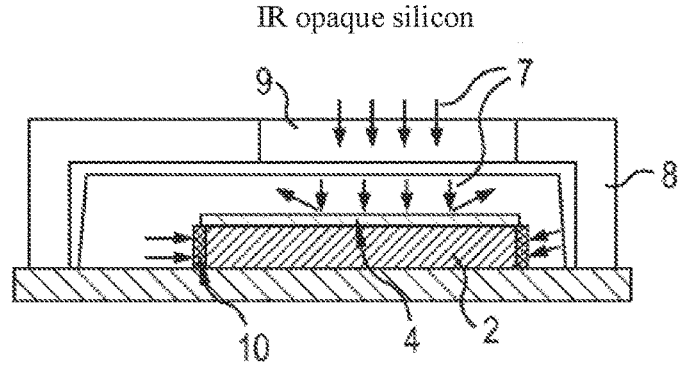

FIG. 8 shows a diagrammatic representation of an IC 2 with UV light sensor 1 in a housing 8. Here, FIG. 8a shows the interfering radiation penetrating the UV light sensor 1 due to the absence of stray light suppressing means, whereas, in FIG. 8b, light barriers 10 that laterally border the IC 2 are arranged, in order to prevent the penetration of the interfering radiation into the UV light sensor 1 outside of the sensitive sensor surface 1.

FIG. 9 shows a kind of summary of the possible stray light suppressing means. The vertical penetration of light 7 from the back side of the IC 2 or UV light sensor 1, can be prevented by an encapsulation with an opaque material 11, for example, with a suitable molding material, in the packing process. Moreover, the horizontal penetration of light 7 via the IC chip edges can be achieved by the covering of the chip margin with appropriate light-screening materials 11 during the packing process, wherein, for example, light barriers 10 that laterally border the IC 2 are arranged, or the entire IC 2 is embedded in an opaque molding material 11.

FIG. 10 shows a diagrammatic representation of stray light suppressing means that are formed by closed contact rings 12 and/or by via rings arranged offset, as a result of which the penetration of stray light due to reflections or light guiding into the intermetallic dielectric materials in the metallization complex of the IC 2 (oxides between wiring planes) or passivation planes is prevented.

FIG. 11 shows a diagrammatic representation of the result of the compensation of the VIS/IR sensitivity of a Si photodiode by the compensation with a photodiode which is coated with poly-Si, for case a) without UV filter and b) with UV filter, for the purpose of which the method according to the invention is used for the detection of UV light with a UV light sensor 1. For example, in a UV light sensor 1 consisting of at least one photodiode with UV filter (UV diode) or at least one polysilicon layer-coated photodiode with UV filter (UV poly diode), the VIS/IR sensibility of the Si diodes is suppressed by the following exemplary method steps: the output signal of the UV diode is measured. This output signal consists of UV+VIS/IR stray light+leakage current components. With the poly UV diode, a second output signal is measured. This second output signal consists of the a1*VIS/IR stray light+a2*leakage current components. The stray light of the two diodes is not identical, represented by the factor a1 which is not equal to 1. Thus, the difference would not exactly be the desired UV component, that is to say the compensation would not be optimal. The optimization is achieved in that a weighted difference is determined, for example, the UV poly diode is first weighted by 1/(a1) and then the difference is determined. The leakage currents are compensated for the case in which a2 is equal (approximately) to 1.

For the suppression of the VIS/IR sensitivity of the Si diodes, vertically stacked PN transitions (pinched Si diodes) can also be used, in order to eliminate the VIS/IR sensitivity from the photocurrent used.

Here occurs in principle a division of the photocurrents resulting from charge carrier generation into components that are generated by long-wave light at greater depth in the silicon, and components that are generated by short-wave light on the surface.

In an additional embodiment example, in order to suppress temperature-dependent and fabrication-caused leakage currents, a compensation method is also used, wherein, in a UV light sensor (1) consisting of at least one photodiode with UV filter (UV diode) and at least one dark diode (DD) coated with a metal layer, the temperature-dependent and fabrication-caused leakage currents of the Si diodes are suppressed by the following exemplary method steps: the output signal of the UV diode is measured. This output signal consists of the UV+leakage current components. With the dark diode, a second output signal is measured. This second output signal comprises the a2*leakage current component. Subsequently, for example, a compensation is carried out by determining the difference between the two measured output signals. In the case in which a2 is not equal to 1, the optimization is achieved in that a weighted difference is determined, for example, the dark diode is first weighted by 1/(a2), and then the difference is determined. For example, storage of trim values can also occur, in order to carry out a chip- and diode-based programmable dark current calibration.

If the UV light sensor 1 consists of at least one photodiode with UV filter (UV diode), at least one a polysilicon layer-coated photodiode with UV filter (UV poly diode), and at least one dark diode DD coated with a metal layer, then a compensation of the VIS/IR sensitivity and of the leakage currents of the Si photodiodes can occur at the same time. If, for example, the UV light sensor 1 comprises a photodiode with UV filter (D1), a photodiode with UV filter which is coated with a polysilicon layer (D2), and a UV dark diode (D3) coated with metal, then the output signals of the three diodes have the following composition:

$D1$=UV+VIS/IR stray+leakage current;

$D2$=$a1$*VIS/IR stray+$a2\_2$*leakage current;

$D3$=+$a2\_3$*leakage current.

In a first step, a weighted compensation of the leakage currents occurs by calculation of D13=(D1−x1*D3) and D23=(D2−x2*D3) and determination of x1 and x2 taking into consideration a2_2 and a2_3.

In a second step, the weighted compensation of the VIS/IR sensitivity occurs by calculation of UV=D13−x3*D23 and determination of x3 taking into consideration a1. The homogenization of the leakage currents can also occur by optimized healing in the fabrication process.

If the UV light sensor 1 consists of a matrix of several sensor elements (FIG. 12), then, by means of a filter arrangement composed in accordance with certain arrangement criteria, wherein the filters consist of function-dependent filter materials, remaining stray light, or different leakage current effects, can be homogenized. For example, in this way, an optimal half-space sensitivity of the UV light sensor 1 and, under some circumstances, a suppression of particles or fabrication residues on the UV light sensor 1 can also be compensated. Here, the sensor elements 13 forming the UV light sensor 1 are arranged in a matrix structure, wherein, by means of a geometric center-of-gravity formation, an equal-value averaging of light components from all spatial directions above the UV light sensor occurs. If, in a 4×4 matrix arrangement with a total of 16 photodiodes, four different filter materials are associated with these 16 photodiodes, i.e., the photodiodes perform different functions in accordance with their associated filters, then the filter arrangement must meet the following criteria: The four different filters are arranged once in the corner, twice on the side edge, once per row, once per column, and once in the four 2×2 sub quadrants. The four different filters are then also associated with different measurement channels. FIG. 12 shows such an arrangement of different filters. Here, it is particularly advantageous that, stray light arriving in the array, for example, when the filter marked G is covered not with UV filters, but instead with another filter, for example, a photo-optical filter, visible light intendedly arrives through these filters, visible light which can then scatter towards the UV diodes and UV poly diodes. In order not to negatively influence the stray light compensation thereof, these diodes should see to the extent possible the identical stray light components, even in the case of different incidence angles of the light.

LIST OF REFERENCE NUMERALS

1 UV light sensor
2 IC (integrated circuit)
3 Contact pads
31 Vias, bond pads of the sensor elements
4 UV filter
5 Second filter material
6 Metal layer
7 Incident radiation
8 Housing
9 Optical opening
10 Light barrier
11 Opaque material
12 Closed contact rings
13 Sensor element
14 Active sensor element surface
15 Substrate
16 Substrate surface
17 Passivation layer
18 Functional layer
19 Stray light suppressing means
20 Processing unit of the IC
DD Dark diode

The invention claimed is:

1. A UV light sensor produced by a CMOS process, comprising:
   a substrate that has a surface;
   one or more sensor elements that detect radiation and formed in the substrate;
   at least one passivation layer arranged over the surface of the substrate, characterized in that the passivation layer is planar and leveled by an ablation process;
   a functional layer arranged over the passivation layer, wherein the functional layer includes at least one filter, characterized in that the filter is formed directly on the planar passivation layer; and
   a stray light suppressor is formed around the at least one sensor element and/or around the UV light sensor, the stray light suppressor being formed at least partially by light barriers which are vertical with respect to the substrate surface in wiring planes formed above the sensor elements formed in the substrate in the CMOS process.

2. The UV light sensor according to claim 1, characterized in that the stray light suppressor is formed at least partially by a filter.

3. The UV light sensor according to claim 1, characterized in that the stray light suppressor is formed at least partially by a metal layer arranged over the entire surface of the UV light sensor, leaving the sensor elements uncovered.

4. The UV light sensor according to claim 1, characterized in that the stray light suppressor is formed at least partially by light barriers bordering the UV light sensor laterally.

5. The UV light sensor according to claim 1, characterized in that the stray light suppressor is formed at least partially by an embedding of the UV light sensor (1) in an opaque material, wherein the opaque material encloses the margin of the UV light sensor.

6. The UV light sensor according to claim 1, characterized in that the stray light suppressor is formed at least partially by an opaque material on the back side of the UV light sensor.

7. The UV light sensor according to claim 1, characterized in that the stray light suppressor is formed at least partially by trenches filled with opaque material that laterally border the respective sensor element.

8. The UV light sensor according to claim 1, characterized in that the vertical light barriers in the CMOS vertical wiring planes are formed by closed contact rings and/or by via rings offset from the one or more sensor elements and extending into a top metallization plane of the CMOS process.

9. The UV light sensor according to claim 1, characterized in that the one or more sensor elements are arranged in a matrix.

10. The UV light sensor according to claim 1, characterized in that, over the radiation detecting sensor elements, the at least one filter includes a plurality of filters, each formed from different filter materials, wherein the plurality of filters partially overlap one another and/or the plurality of filters are formed so that they partially overlap one or more of the sensor elements.

11. The UV light sensor according to claim 1, characterized in that the one or more sensor elements form one or more of a group consisting of photodiodes, (ambient light sensor (ALS), and dark current compensating sensors.

12. The UV light sensor according to claim 1, characterized in that the one or more sensor elements are arranged in a matrix, wherein the sensor elements comprise at least one photodiode with UV filter, an ambient light sensor (ALS), and a photodiode with a polysilicon coating and a UV filter.

13. The UV light sensor according to claim 12, characterized in that the matrix is a 4×4 matrix with optimized half-space sensitivity, the four sensors of the one or more sensors including different sensor types.

14. The UV light sensor according to claim 13, characterized in that the optimized half-space sensitivity is set in that different sensor element types meet the following arrangement criteria:
   each sensor element type is arranged once in the corner of the diode matrix,
   each sensor element type is arranged twice on the side edge of the diode matrix
   each sensor element type is arranged once per row of the diode matrix,
   each sensor element type is arranged once per column of the diode matrix, and
   each sensor element type is arranged once in the four 2×2 sub quadrants of the diode matrix.

15. A method for detecting UV light with a UV light sensor, the UV light sensor including one or more sensor elements that detect radiation formed in a substrate, at least one passivation layer arranged over the substrate characterized in that the passivation layer is planer and leveled by an ablation process, a function layer arranged over the passivation layer, wherein the functional layer includes at least one filter, and a stray light suppressor formed around the at least one sensor element, the stray light suppressor being formed at least partially by light barriers which are vertical with respect to the substrate surface in wiring planes formed above the sensor elements formed in the substrate, wherein each of the one or more sensor elements detect light and in response thereto generate a signal, comprising:
   measuring a first output signal of a first sensor element, the first sensor element being formed as a photodiode;
   measuring a second output signal of a second sensor element, the second sensor element formed as a photodiode with a polysilicon coating;
   weighting the second output signal by a factor; and
   determining a mathematical relationship between the first and second output signals.

16. The method according to claim 15, wherein determining the mathematical relationship includes calculating a difference between the first output signal and the second output signal.

17. The method according to claim 16, characterized in that the first sensor element forms one of a UV component, a VI S/IR component, and a leakage current component.

18. The method according to claim 16, characterized in that the second sensor elements forms one of a weighted VIS/IR component and a weighted leakage current component.

19. A method for detecting UV light with a UV light sensor, the UV light sensor including one or more sensor elements that detect radiation formed in a substrate, at least one passivation layer arranged over the substrate characterized in that the passivation layer is planer and leveled by an ablation process, a function layer arranged over the passivation layer, wherein the functional layer includes at least one filter, and a stray light suppressor formed around the at least one sensor element, the stray light suppressor being formed at least partially by light barriers which are vertical with respect to the substrate surface in wiring planes formed above the sensor elements formed in the substrate, wherein each of the one or more sensor elements can detect light and in response thereto generate a signal, comprising:
   measuring a first output signal of a first sensor element, which is formed as a photodiode;
   measuring a second output signal of a second sensor element, which is formed as a dark diode, wherein the dark diode is coated with an opaque metal;
   weighting the second output signal by a factor; and
   determining a mathematical relationship between the first and second output signals.

20. The method according to claim 19, wherein determining the mathematical includes calculating the difference between the first output signal and the second output signal.

21. The method according to claim 20, characterized in that the first sensor element forms one of a UV component, a VI S/IR component, and a leakage current component.

22. The method according to claim 20, characterized in that the second sensor elements forms one of a weighted VIS/IR component and a weighted leakage current component.

* * * * *